United States Patent
Fu et al.

(10) Patent No.: US 10,522,441 B2
(45) Date of Patent: Dec. 31, 2019

(54) INTEGRATED CIRCUIT DIE AND MANUFACTURE METHOD THEREOF

(71) Applicant: HUAWEI TECHNOLOGIES CO., LTD., Shenzhen, Guangdong (CN)

(72) Inventors: HuiLi Fu, Shenzhen (CN); Shujie Cai, Shenzhen (CN); Feiyu Luo, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/797,549

(22) Filed: Oct. 30, 2017

(65) Prior Publication Data
US 2018/0068922 A1     Mar. 8, 2018

Related U.S. Application Data

(63) Continuation of application No. PCT/CN2016/080514, filed on Apr. 28, 2016.

(30) Foreign Application Priority Data

Apr. 30, 2015  (CN) .......................... 2015 1 0221081

(51) Int. Cl.
*H01L 23/36*     (2006.01)
*H01L 23/367*    (2006.01)
(Continued)

(52) U.S. Cl.
CPC ...... *H01L 23/367* (2013.01); *H01L 21/02107* (2013.01); *H01L 21/76895* (2013.01);
(Continued)

(58) Field of Classification Search
CPC .................. H01L 23/367; H01L 23/528; H01L 21/02107; H01L 24/03; H01L 21/76895
See application file for complete search history.

(56) References Cited

U.S. PATENT DOCUMENTS

| 4,764,804 A |   | 8/1988 | Sahara et al. |
| 5,939,739 A | * | 8/1999 | O'Keefe ............. H01L 21/7605 257/197 |

(Continued)

FOREIGN PATENT DOCUMENTS

| CN | 101026148 | 8/2007 |
| CN | 101106113 | 1/2008 |

(Continued)

OTHER PUBLICATIONS

Extended European Search Report, dated Mar. 29, 2018, in European Application No. 16785938.8 (10 pp.).

(Continued)

*Primary Examiner* — William Coleman
(74) *Attorney, Agent, or Firm* — Conley Rose, P.C.

(57) ABSTRACT

The present invention provide an IC die, including an underlay; an active component; an interconnection layer, covering the active component, where the interconnection layer includes multiple metal layers and multiple dielectric layers, the multiple metal layers and the multiple dielectric layers are alternately arranged, a metal layer whose distance to the active component is the farthest in the multiple metal layers includes metal cabling and a metal welding pad; and a heat dissipation layer, where the heat dissipation layer covers a region above the interconnection layer except a position corresponding to the metal welding pad, the heat dissipation layer is located under a package layer, the package layer includes a plastic packaging material, and the heat dissipation layer includes an electrical-insulating material whose heat conductivity is greater than a preset value.

13 Claims, 5 Drawing Sheets

(51) Int. Cl.
  *H01L 21/02* (2006.01)
  *H01L 21/768* (2006.01)
  *H01L 23/31* (2006.01)
  *H01L 23/528* (2006.01)
  *H01L 23/00* (2006.01)

(52) U.S. Cl.
  CPC ...... *H01L 23/3171* (2013.01); *H01L 23/3192* (2013.01); *H01L 23/528* (2013.01); *H01L 24/45* (2013.01); H01L 23/3128 (2013.01); H01L 24/03 (2013.01); H01L 24/05 (2013.01); H01L 24/16 (2013.01); H01L 24/32 (2013.01); H01L 24/48 (2013.01); H01L 24/73 (2013.01); H01L 2224/03462 (2013.01); H01L 2224/0401 (2013.01); H01L 2224/04042 (2013.01); H01L 2224/13023 (2013.01); H01L 2224/16225 (2013.01); H01L 2224/32225 (2013.01); H01L 2224/48091 (2013.01); H01L 2224/48106 (2013.01); H01L 2224/48225 (2013.01); H01L 2224/73204 (2013.01); H01L 2224/73265 (2013.01); H01L 2924/14 (2013.01)

(56) References Cited

U.S. PATENT DOCUMENTS

| | | | |
|---|---|---|---|
| 6,756,670 B1 | 6/2004 | Yamazaki et al. | |
| 6,970,362 B1* | 11/2005 | Chakravorty | H01L 23/50 257/E23.079 |
| 7,126,218 B1* | 10/2006 | Darveaux | H01L 23/3128 257/706 |
| 8,492,911 B2* | 7/2013 | Bachman | H01L 23/3677 257/675 |
| 9,472,533 B2* | 10/2016 | Pendse | H01L 24/19 |
| 9,496,198 B2* | 11/2016 | Venugopal | H01L 23/3675 |
| 9,502,489 B2* | 11/2016 | Funaya | H01L 24/49 |
| 2001/0018800 A1 | 9/2001 | Tzanavaras et al. | |
| 2002/0197766 A1 | 12/2002 | Akram et al. | |
| 2003/0214037 A1 | 11/2003 | Telkamp | |
| 2005/0012225 A1* | 1/2005 | Choi | H01L 21/568 257/782 |
| 2005/0167799 A1 | 8/2005 | Doan | |
| 2007/0267740 A1 | 11/2007 | Khan et al. | |
| 2007/0290322 A1 | 12/2007 | Zhao et al. | |
| 2009/0057895 A1 | 3/2009 | Lin et al. | |
| 2012/0001200 A1 | 1/2012 | Ikoshi et al. | |
| 2014/0151856 A1 | 6/2014 | Otremba et al. | |
| 2015/0348940 A1* | 12/2015 | Woychik | H01L 25/0657 257/774 |
| 2017/0055365 A1* | 2/2017 | Sanders | H01L 23/36 |

FOREIGN PATENT DOCUMENTS

| | | |
|---|---|---|
| CN | 101127334 | 2/2008 |
| CN | 101980360 | 2/2011 |
| CN | 103855109 | 6/2014 |
| CN | 203733779 U | 7/2014 |
| CN | 104851860 | 8/2015 |

OTHER PUBLICATIONS

International Search Report, dated Aug. 2, 2016, in International Application No. PCT/CN2016/080514 (3 pp.).
Written Opinion of the International Searching Authority, dated Aug. 2, 2016, in International Application No. PCT/CN2016/080514 (4 pp.).
Office Action, dated Mar. 20, 2017, in Chinese Application No. 201510221081.2 (8 pp.).
International Search Report dated Aug. 2, 2016 in corresponding International Patent Application No. PCT/CN2016/080514.
Machine Translation and Abstract of Chinese Publication No. CN203733779, Jul. 23, 2014, 9 pages.
Foreign Communication From a Counterpart Application, Chinese Application No. 201810166272.7, Chinese Office Action dated May 17, 2019, 6 pages.

* cited by examiner

FIG. 1

<Prior Art>

INTEGRATED CIRCUIT DIE AND MANUFACTURE METHOD THEREOF

CROSS-REFERENCE TO RELATED APPLICATIONS

This application is a continuation of International Application No. PCT/CN2016/080514, filed on Apr. 28, 2016, which claims priority to Chinese Patent Application No. 201510221081.2, filed on Apr. 30, 2015. The disclosures of the aforementioned applications are hereby incorporated by reference in their entireties.

TECHNICAL FIELD

The present invention relates to the field of integrated circuits, and in particular, to an integrated circuit die and a preparation method thereof.

BACKGROUND

As an integration level of an integrated circuit (IC) chip is increasingly high, power density of the chip is higher. In addition, the power density is also unevenly distributed across the entire IC chip. In a region whose power density is relatively high, a large amount of heat is generated within a range with an extremely small area, and consequently, a heat point with an extremely high temperature is formed on a surface of the chip. Temperatures of these "heat points" are much higher than an average temperature of the entire IC chip. If heat in heat-point regions cannot be rapidly spread because effective heat management and an effective heat dissipation design are not performed on the IC chip, temperatures in the heat-point regions of the chip easily become excessively high, and consequently, the chip cannot normally work.

Figure 1:
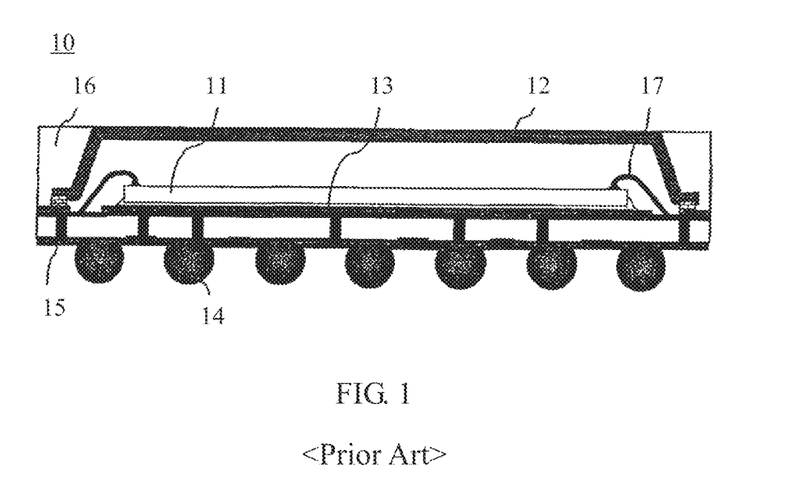
FIG. 1 is a cross-sectional view of an IC chip according to the prior art.

Currently, a heat dissipation design of an IC chip is mainly adding a heat sink on an IC chip package. FIG. 1 shows a die-up plastic ball grid array package body 10 on which a heat sink 12 is integrated. In the package body 10, an IC die 11 is mounted on a underlay 15 by using a die bonding material 13, and is connected to a leading wire 17. The package body 10 can be connected to a printed circuit board (not shown in FIG. 1) by using a solder ball 14. The heat sink 12 is disposed on the underlay 15, and is configured to dissipate heat of the die 11. A plastic packaging material 16 seals the package body 10. In FIG. 1, a material of the heat sink 12 is a conductive material. Therefore, the heat sink 12 and the die 11 need to be insulated from each other by using the insulating plastic packaging material 16. In FIG. 1, the heat sink 12 is mostly located on the plastic packaging material 16, that is, the heat sink 12 is mostly located at a package layer formed by the plastic packaging material 16.

A heat dissipation method used for the package body shown in FIG. 1 is to design a heat path in an IC chip package structure, so as to spread heat of heat points by using the heat sink. According to this heat dissipation method, cooling is indiscriminately performed on the entire chip to remove the heat from the entire package body, so as to maintain a temperature of the chip under an upper limit of working.

However, the added heat sink still cannot be infinitely close to the IC die due to some physical limitations of an IC chip package technology and the IC chip package structure, and the IC die is a heat source. Therefore, a method for adding a heat sink to an IC chip package is not enough for reducing the temperatures of the heat points on the surface of the IC chip, or has a limited effect in an aspect of reducing the temperatures of the heat points. As a result, working of the IC chip is still limited by the temperatures of the heat points on the surface of the IC chip.

In conclusion, in a current heat dissipation method of an IC chip, because a heat sink is mainly added to an IC chip package structure, and the heat sink cannot be infinitely close to an IC die, this heat dissipation method has a limited effect in an aspect of reducing a temperature of a heat point on a surface of the IC chip.

SUMMARY

Embodiments of the present invention provide an integrated circuit die and a preparation method thereof, so as to resolve a problem that a currently used heat dissipation method of an IC chip has a limited effect in an aspect of reducing a temperature of a heat point on a surface of the IC chip.

According to a first aspect, an integrated circuit die is provided, including:
an underlay;
an active component;
an interconnection layer, covering the active component, where the interconnection layer includes multiple metal layers and multiple dielectric layers, the multiple metal layers and the multiple dielectric layers are alternately arranged, a metal layer whose distance to the active component is the farthest in the multiple metal layers includes metal cabling and a metal welding pad; and
a heat dissipation layer, where the heat dissipation layer covers a region above the interconnection layer except a position corresponding to the metal welding pad, the heat dissipation layer is located under a package layer, the package layer includes a plastic packaging material, and the heat dissipation layer includes an electrical-insulating material whose heat conductivity is greater than a preset value.

With reference to the first aspect, in a first possible implementation manner, the heat dissipation layer covers the metal layer whose distance to the active component is the farthest.

With reference to the first aspect, in a second possible implementation manner, the interconnection layer further includes a passivation layer; the passivation layer covers a region, above the metal layer whose distance to the active component is the farthest, except the position corresponding to the metal welding pad; and the heat dissipation layer covers the passivation layer.

With reference to the first aspect, in a third possible implementation manner, an integrated circuit chip including the integrated circuit die is a wire bonding chip, the heat dissipation layer is formed after a wire bonding technology is applied, and the heat dissipation layer further covers the position corresponding to the metal welding pad.

With reference to the first aspect, the first possible implementation manner of the first aspect, or the second possible implementation manner of the first aspect, in a fourth possible implementation manner, an integrated circuit chip including the integrated circuit die is a wire bonding chip or a flip chip.

According to a second aspect, a preparation method of an integrated circuit die is provided, including:
forming an active component on an underlay;
forming multiple metal layers and multiple dielectric layers on a surface of the active component in a manner of alternate arrangement, where the multiple metal layers and the multiple dielectric layers constitute an interconnection layer, and a metal layer whose distance to the active component is the farthest in the multiple metal layers includes metal cabling and a metal welding pad; and forming, in a region above the interconnection layer except a position corresponding to the metal welding pad, a heat dissipation layer that includes an electrical-insulating material whose heat conductivity is greater than a preset value, where the heat dissipation layer is located under a package layer that includes a plastic packaging material.

With reference to the second aspect, in a first possible implementation manner, the forming, in a region above the interconnection layer except a position corresponding to the metal welding pad, the heat dissipation layer includes:

forming the heat dissipation layer above the metal layer whose distance to the active component is the farthest in the interconnection layer; and disposing an opening at a position that is at the heat dissipation layer and that is corresponding to the metal welding pad.

With reference to the second aspect, in a second possible implementation manner, the integrated circuit die further includes a passivation layer, and the forming, in a region above the interconnection layer except a position corresponding to the metal welding pad, the heat dissipation layer includes:

forming the passivation layer above the metal layer whose distance to the active component is the farthest in the interconnection layer;

disposing an opening at a position that is at the passivation layer and that is corresponding to the metal welding pad;

forming the heat dissipation layer on a surface of the passivation layer; and disposing an opening at a position that is at the heat dissipation layer and that is corresponding to the metal welding pad.

With reference to the second aspect, in a third possible implementation manner, the integrated circuit die further includes a passivation layer, and if an integrated circuit chip including the integrated circuit die is a wire bonding chip, and the heat dissipation layer is formed after a wire bonding technology is applied, the forming, in a region above the interconnection layer except a position corresponding to the metal welding pad, the heat dissipation layer includes:

forming the passivation layer above the metal layer whose distance to the active component is the farthest in the interconnection layer;

disposing an opening at a position that is at the passivation layer and that is corresponding to the metal welding pad; and forming the heat dissipation layer on a surface of the passivation layer.

Beneficial effects of the embodiments of the present invention include:

According to the integrated circuit die and the preparation method thereof provided in the embodiments of the present invention, because a heat dissipation layer covers a region above an interconnection layer in the IC die except a position corresponding to a metal welding pad, and is located under a package layer, the heat dissipation layer can be closer to the IC die. Because a material of the heat dissipation layer is an electrical-insulating material whose heat conductivity is greater than a preset value, the heat dissipation layer can rapidly spread heat in a region whose power density is relatively high in the IC die to a surface of the entire die, thereby increasing a heat dissipation area of an IC chip including the IC die, and improving a heat dissipation capability of the chip.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

According to the IC die and the preparation method thereof provided in embodiments of the present invention, a heat dissipation layer formed by an electrical-insulating material whose heat conductivity is greater than a preset value covers a region above an interconnection layer in the IC die except a position corresponding to a metal welding pad, and the heat dissipation layer is located under a package layer. Therefore, heat in a region whose power density is relatively high in the IC die is rapidly spread to a surface of the entire die, thereby increasing a heat dissipation area of an IC chip, and improving a heat dissipation capability of the chip.

With reference to the accompanying drawings of the specification, the following describes specific implementation manners of the IC die and the preparation method thereof provided in the embodiments of the present invention.

Figure 2:
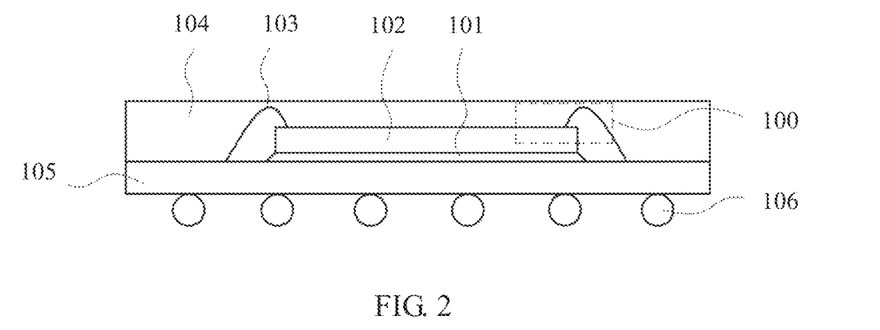
FIG. 2 is a cross-sectional view of a wire bonding chip according to an embodiment of the present invention.
Figure 3:
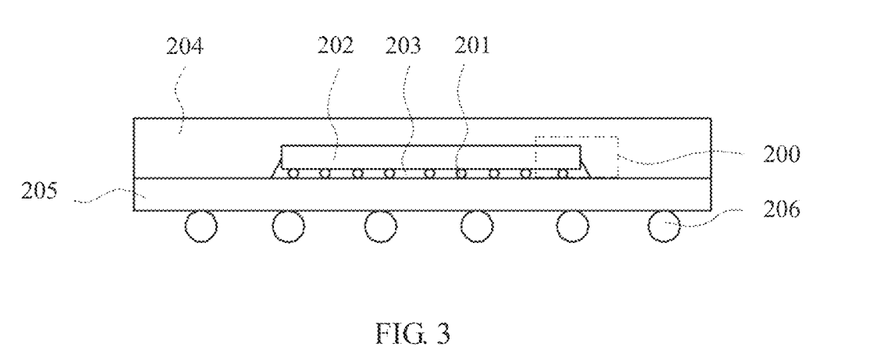
FIG. 3 is a cross-sectional view of a flip chip according to an embodiment of the present invention.

When the IC die provided in the embodiments of the present invention is packaged by using an existing package technology, an IC chip obtained after packaging comprises two types: one is a wire bonding chip shown in FIG. 2, and the other is a flip chip shown in FIG. 3.

The wire bonding chip shown in FIG. 2 includes an IC die 102, a die bonding material 101, a leading wire 103, a plastic packaging material 104, a substrate 105, and a solder ball 106. A general technological process of packaging the wire bonding chip is as follows: first, manufacturing the IC die 102; then, fastening the IC die 102 to the substrate 105 by using the die bonding material 101; next, welding the leading wire 103 to the IC die 102 and the substrate 105 in a manner of wire bonding; afterwards, plastically packaging the IC die 102 by using the plastic packaging material 104; and last, welding the solder ball 106 to the substrate 105, thereby completing packaging of the entire wire bonding chip.

The flip chip shown in FIG. 3 includes an IC die 202, a metal bump (BUMP) 201, an underfill material 203, a plastic packaging material 204, a substrate 205, and a solder ball 206. A general technological process of packaging the flip chip is as follows: first, manufacturing the IC die 202, where the bump 201 is formed on the IC die 202; then, inverting and attaching the IC die 202 to the substrate 205, so as to physically and electrically connect the IC die 202 to the substrate 205 by using the bump 201; next, filling in the underfill material 203 to protect the bump 201; afterwards, plastically packaging the IC die 202 by using the plastic packaging material 204; and last, welding the solder ball 206 to the substrate 205, thereby completing packaging of the entire flip chip.

An embodiment of the present invention provides an IC die, and the IC die includes:

an underlay;

an active component, where the active component covers the underlay;

an interconnection layer, covering the active component, where the interconnection layer includes multiple metal layers and multiple dielectric layers, the multiple metal layers and the multiple dielectric layers are alternately arranged, a metal layer whose distance to the active component is the farthest in the multiple metal layers includes metal cabling and a metal welding pad; and a heat dissipation layer, where the heat dissipation layer covers a region above the interconnection layer except a position corresponding to the metal welding pad, the heat dissipation layer is located under a package layer, the package layer includes a plastic packaging material, and the heat dissipation layer includes an electrical-insulating material whose heat conductivity is greater than a preset value, where the preset value may be 10 W/m-k.

That the multiple metal layers and the multiple dielectric layers are alternately arranged means that a first dielectric layer is formed above the active component first, the first metal layer is formed above the first dielectric layer next, a second dielectric layer is formed above the first metal layer next, and the second metal layer is formed above the second dielectric layer next, . . . , until a quantity of metal layers and that of dielectric layers meet a requirement. Materials of all dielectric layers can be different materials, but are all electrical-insulating materials.

The metal cabling of the metal layer in the interconnection layer is to connect an electrode of the active component to a corresponding position, and the metal welding pad of the metal layer in the interconnection layer is to lead, for convenience of practical application, the electrode of the active component out of a package body that packages the IC die.

The heat dissipation layer may cover a part of the region above the interconnection layer in the IC die except the metal welding pad, or may cover the entire region above the interconnection layer in the IC die except the metal welding pad.

Figure 4A:
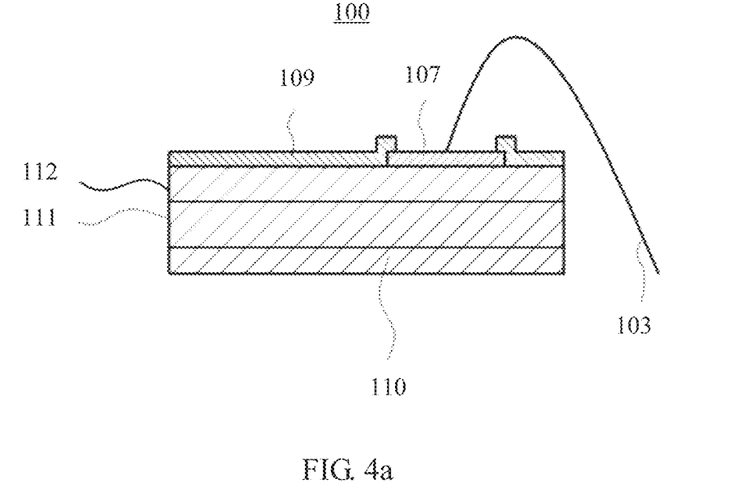
FIG. 4a is a first cross-sectional view of an IC die in a wire bonding chip according to an embodiment of the present invention.
Figure 4B:
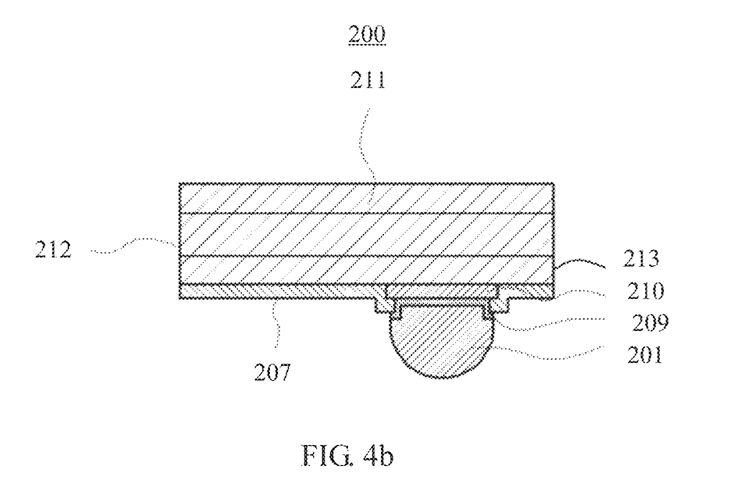
FIG. 4b is a first cross-sectional view of an IC die in a flip chip according to an embodiment of the present invention.

Optionally, as shown in FIG. 4a and FIG. 4b, the heat dissipation layer covers a region, above the metal layer whose distance to the active component in the IC die is the farthest in the interconnection layer in the IC die, except the position corresponding to the metal welding pad, where the heat dissipation layer may cover a part of a region of the metal welding pad in the IC die. In this case, because the material of the heat dissipation layer is an insulating material, the heat dissipation layer in FIG. 4a and FIG. 4b replaces a passivation layer in an IC die in the prior art.

FIG. 4a is a schematic structural diagram of an IC die in which a heat dissipation layer is used to replace a passivation layer when an IC chip is a wire bonding chip. FIG. 4a is a cross-sectional view of a dashed-line block 100 in FIG. 2. In FIG. 4a, the leading wire 103, a metal welding pad 107 that is located at a metal layer whose distance to an active component 111 is the farthest in an interconnection layer 112, a heat dissipation layer 109, and a underlay 110 are included. In FIG. 4a, the heat dissipation layer 109 further has a function of a passivation layer.

When the IC die shown in FIG. 4a is being produced, first, the active component 111 is formed on the underlay 110; then, multiple metal layers and multiple dielectric layers are alternately formed above the active component 111, where the multiple metal layers and the multiple dielectric layers constitute the interconnection layer 112, and the metal layer whose distance to the active component 111 is the farthest in the interconnection layer 112 contains the metal welding pad 107; and last, the heat dissipation layer 109 is formed above the metal layer that contains the metal welding pad 107, and an opening is disposed in a region that is at the heat dissipation layer and that directly faces the metal welding pad, where the opening may be smaller than the metal welding pad directly faced by the opening, provided that the IC die can be connected to a substrate in a heat dissipation enhanced IC chip by using a region that is on the metal welding pad and that directly faces the opening.

FIG. 4b is a schematic structural diagram of an IC die in which a heat dissipation layer is used to replace a passivation layer when an IC chip is a flip chip. FIG. 4b is a cross-sectional view of a dashed-line block 200 in FIG. 3. In FIG. 4b, the metal bump 201, a heat dissipation layer 207, under bump metal (UBM, under bump metal) 209, a metal welding pad 210 that is located at a metal layer whose distance to an active component 212 is the farthest in an interconnection layer 213, and a underlay 211 are included. In FIG. 4b, the heat dissipation layer 207 further has a function of the passivation layer.

When the IC die shown in FIG. 4b is being produced, first, the active component 212 is formed on the underlay 211; then, multiple metal layers and multiple dielectric layers are alternately formed above the active component 212, where the multiple metal layers and the multiple dielectric layers constitute the interconnection layer 213, and the metal layer whose distance to the active component 212 is the farthest in the interconnection layer 213 contains the metal welding pad 210; last, the heat dissipation layer 207 is formed above the metal layer that contains the metal welding pad 210, and an opening is disposed in a region that is at the heat dissipation layer 207 and that directly faces the metal welding pad 210, where the opening may be smaller than the metal welding pad directly faced by the opening, provided that the IC die can be connected to a substrate in a heat dissipation enhanced IC chip by using a region that is at the metal welding pad and directly faces the opening; and next, the UBM 209 and the metal bump 201 are sequentially produced upon the metal welding pad 210.

Figure 5A:
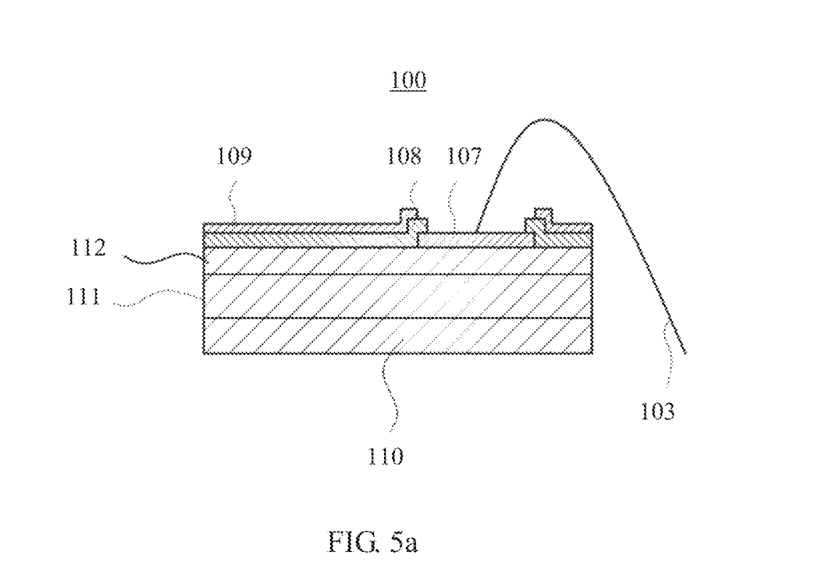
FIG. 5a is a second cross-sectional view of an IC die in a wire bonding chip according to an embodiment of the present invention.
Figure 5B:
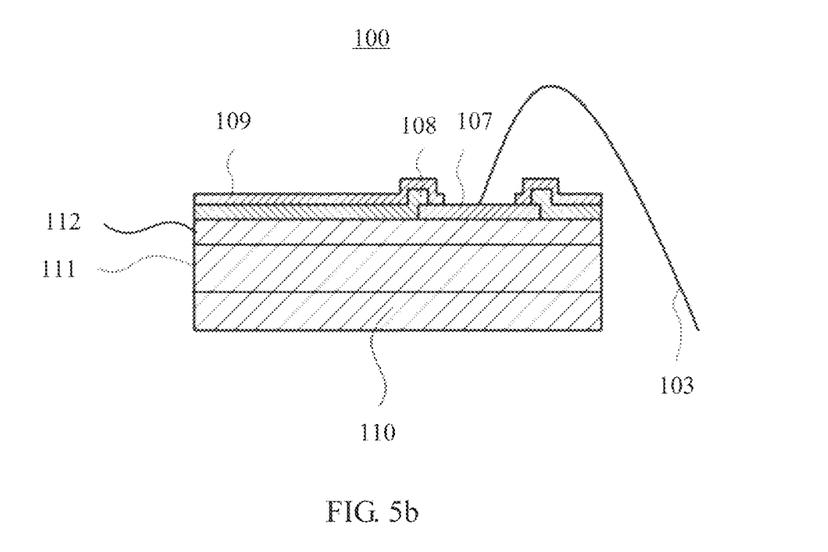
FIG. 5b is a third cross-sectional view of an IC die in a wire bonding chip according to an embodiment of the present invention.
Figure 6A:
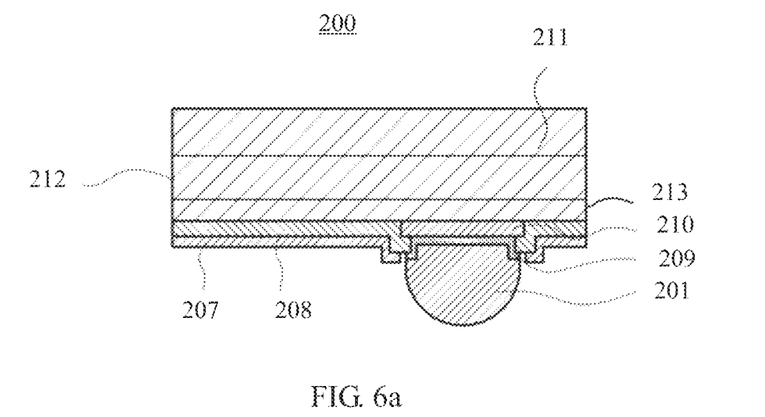
FIG. 6a is a second cross-sectional view of an IC die in a flip chip according to an embodiment of the present invention.
Figure 6B:
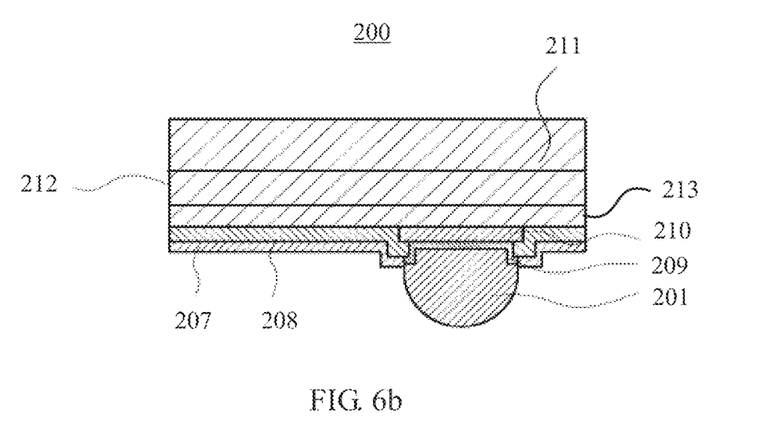
FIG. 6b is a third cross-sectional view of an IC die in a flip chip according to an embodiment of the present invention.

Optionally, when the interconnection layer in the IC die further includes a passivation layer, the passivation layer covers a region, above the metal layer whose distance to the active component is the farthest, except the position corresponding to the metal welding pad, and the heat dissipation layer covers the passivation layer. In this case, when an IC chip is a wire bonding chip, the IC die provided in this embodiment of the present invention is shown in FIG. 5a and FIG. 5b. When an IC chip is a flip chip, the IC die provided in this embodiment of the present invention is shown in FIG. 6a and FIG. 6b.

The IC die 102 shown in FIG. 5a includes a underlay 110, an active component 111, an interconnection layer 112, a passivation layer 108, and a metal welding pad 107 that is located at a metal layer whose distance to the active component 111 is the farthest in the interconnection layer 112. A heat dissipation layer 109 covers the passivation layer 108. An opening that is at the passivation layer 108 and that directly faces the metal welding pad 107 is smaller than or equal to an opening that is at the heat dissipation layer 109 and that directly faces the metal welding pad 107. In FIG. 5a, description is made by using an example that the opening that is at the passivation layer 108 and that directly faces the metal welding pad 107 is smaller than the opening that is at the heat dissipation layer 109 and that directly faces the metal welding pad 107. In FIG. 5a, the leading wire 103 is further included. FIG. 5a is a cross-sectional view of a dashed-line block 100 in FIG. 2.

In a process of producing the IC die shown in FIG. 5a, first, the active component 111 is formed on the underlay 110; then, multiple metal layers and multiple dielectric layers are alternately formed above the active component 111, where the multiple metal layers and the multiple dielectric layers constitute the interconnection layer 112, and the metal layer whose distance to the active component 111 is the farthest in the interconnection layer 112 contains the metal welding pad 107; next, the passivation layer 108 is formed above the metal layer that contains the metal welding pad 107, and an opening is disposed in a region that is at the passivation layer 108 and that directly faces the metal welding pad; afterwards, the heat dissipation layer 109 is formed above the passivation layer 108, and an opening is disposed in a region that is at the heat dissipation layer 109 and that directly faces the metal welding pad 107; and last, wire bonding is performed. The opening that is at the heat dissipation layer 109 and that directly faces the metal welding pad 107 is not smaller than the opening that is at the passivation layer 108 and that directly faces the metal welding pad 107. That is, in the process of producing the IC die shown in FIG. 5a, the heat dissipation layer 109 is formed before wire bonding is performed.

The IC die 102 shown in FIG. 5b includes a underlay 110, an active component 111, an interconnection layer 112, a passivation layer 108, and a metal welding pad 107 that is located at a metal layer whose distance to the active component 111 is the farthest in the interconnection layer 112. A heat dissipation layer 109 covers the passivation layer 108. In FIG. 5b, the leading wire 103 is further included. FIG. 5b is a cross-sectional view of a dashed-line block 100 in FIG. 2.

In a process of producing the IC die shown in FIG. 5b, first, the active component 111 is formed on the underlay 110; then, multiple metal layers and multiple dielectric layers are alternately formed above the active component 111, where the multiple metal layers and the multiple dielectric layers constitute the interconnection layer 112, and the metal layer whose distance to the active component 111 is the farthest in the interconnection layer 112 contains the metal welding pad 107; next, the passivation layer 108 is formed above the metal layer that contains the metal welding pad 107, and an opening is disposed in a region that is at the passivation layer 108 and that directly faces the metal welding pad 107; afterwards, wire bonding is performed; and last, the heat dissipation layer 109 is formed on an active surface of the IC die. That is, in the process of producing the IC die shown in FIG. 5b, wire bonding is performed before the heat dissipation layer is formed. After the heat dissipation layer is formed, the heat dissipation layer 109 on the metal welding pad 107 can be removed, that is, an opening (shown in FIG. 5b) is disposed at a position that is at the heat dissipation layer 109 and that directly faces the metal welding pad 107. A size relationship between the opening that is at the passivation layer 108 and that directly faces the metal welding pad 107 and the opening that is at the heat dissipation layer 109 and that directly faces the metal welding pad 107 is not limited. Certainly, after the heat dissipation layer 109 is formed, the heat dissipation layer on the metal welding pad 107 may also not be removed. In addition, in FIG. 5b, description is made by using an example that the opening that is at the passivation layer 108 and that directly faces the metal welding pad 107 is larger than the opening that is at the heat dissipation layer 109 and that directly faces the metal welding pad 107.

The IC die 202 shown in FIG. 6a includes a underlay 211, an active component 212, an interconnection layer 213, where a UBM 209 is electroplated on a metal welding pad 210, the bump 201 is electroplated on the UBM 209, a heat dissipation layer 207 covers a passivation layer 208, and the metal welding pad 210 is located at a metal layer whose distance to the active component 212 is the farthest in the interconnection layer 213. FIG. 6a is a cross-sectional view of a dashed-line block 200 in FIG. 3.

In a process of producing the IC die shown in FIG. 6a, first, the active component 212 is formed on the underlay 211; then, multiple metal layers and multiple dielectric layers are alternately formed above the active component 212, where the multiple metal layers and the multiple dielectric layers constitute the interconnection layer 213, and the metal layer whose distance to the active component 212 is the farthest in the interconnection layer 213 contains the metal welding pad 210; next, the passivation layer 208 is formed above the metal layer that contains the metal welding pad 210, an opening is disposed in a region that is at the passivation layer 208 and that directly faces the metal welding pad 210, and the UBM 209 is electroplated in the opening region; afterwards, the heat dissipation layer 207 is formed above the passivation layer 208, and an opening is disposed in a region that is at the heat dissipation layer 207 and that directly faces the metal welding pad 210; and last, the bump 201 is electroplated on the UBM 209. The opening that is at the heat dissipation layer 207 and that directly faces the metal welding pad 210 is not smaller than the opening that is at the passivation layer 208 and that directly faces the metal welding pad 210.

The IC die 202 shown in FIG. 6b includes a underlay 211, an active component 212, an interconnection layer 213, where a UBM 209 is electroplated on a metal welding pad 210, the bump 201 is electroplated on the UBM 209, a heat dissipation layer 207 covers a passivation layer 208, and the metal welding pad 210 is located at a metal layer whose distance to the active component 212 is the farthest in the interconnection layer 213. FIG. 6b is a cross-sectional view of a dashed-line block 200 in FIG. 3.

In a process of producing the IC die shown in FIG. 6b, first, the active component 212 is formed on the underlay 110; then, multiple metal layers and multiple dielectric layers are alternately formed above the active component 212, where the multiple metal layers and the multiple dielectric layers constitute the interconnection layer 213, and the metal layer whose distance to the active component 212 is the farthest in the interconnection layer 213 contains the metal welding pad 210; next, the passivation layer 208 is formed above the metal layer that contains the metal welding pad 210, an opening is disposed in a region that is at the passivation layer 208 and that directly faces the metal welding pad 210, and the UBM 209 is electroplated in the opening region; afterwards, the bump 201 is electroplated on the UBM 209, and the heat dissipation layer 207 is formed above the passivation layer 208; and last, because the IC die in the flip chip is connected to the substrate in the IC chip by using the bump 201, the heat dissipation layer 207 on a surface of the bump 201 further needs to be removed. The opening that is at the heat dissipation layer 207 and that directly faces the metal welding pad 210 is not smaller than the opening that is at the passivation layer 208 and that directly faces the metal welding pad 210.

Figure 7:
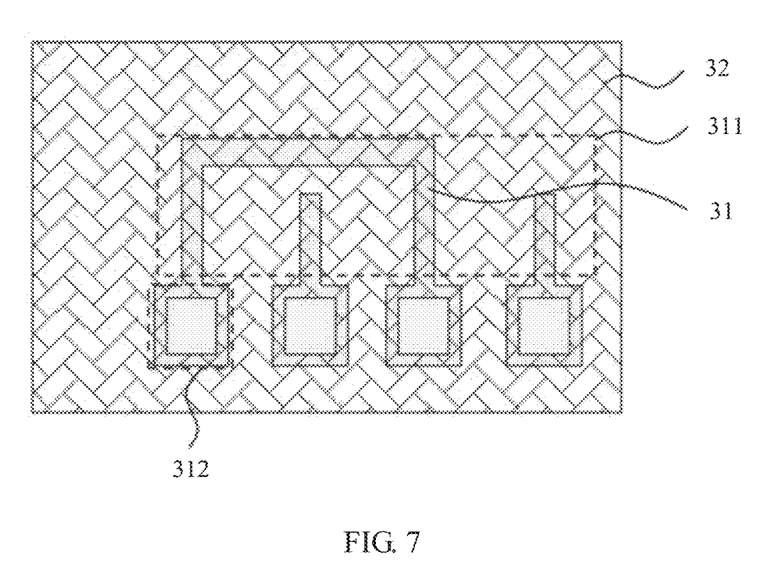
FIG. 7 is a top view of an IC die according to an embodiment of the present invention.

A top view of the IC die in the chip shown in FIG. 2 or FIG. 3 may be shown in FIG. 7, and each includes an underlay, an active component, an interconnection layer, and a heat dissipation layer. When the interconnection layer in FIG. 7 further includes a passivation layer. FIG. 7 is a top view of any IC die of the IC dies shown in FIG. 5a, FIG. 5b, FIG. 6a, and FIG. 6b. When the interconnection layer in FIG. 7 does not include a passivation layer, FIG. 7 is a top view of the IC die shown in FIG. 4a or FIG. 4b.

In FIG. 7, a metal layer 31 whose distance to the active component is the farthest in the interconnection layer covering the active component in the IC die, and a heat dissipation layer 32 are included. The metal layer 31 may be further divided into metal cabling 311 and metal welding pads 312 in the metal layer. Some openings are disposed at positions that are at the heat dissipation layer 32 and that directly face the metal welding pads 312 of the metal layer 31, where each opening may be smaller than a corresponding metal welding pad. That is, the passivation layer covering the opening positions above the metal welding pads 312 needs to be removed, so that the IC die can be connected to a substrate in the IC chip by using the metal welding pads 312 that is not covered by the passivation layer.

In practice, a shape of the metal layer whose distance to the active component is the farthest in the interconnection layer covering the active component in the IC die is not limited to a shape shown in FIG. 7.

An embodiment of the present invention provides a preparation method of an IC die, and the method includes:

forming an active component on an underlay;

forming multiple metal layers and multiple dielectric layers on a surface of the active component in a manner of alternate arrangement, where the multiple metal layers and the multiple dielectric layers constitute an interconnection layer, and a metal layer whose distance to the active component is the farthest in the multiple metal layers includes metal cabling and a metal welding pad; and forming, in a region above the interconnection layer except a position corresponding to the metal welding pad, a heat dissipation layer that includes an electrical-insulating material whose heat conductivity is greater than a preset value, where the heat dissipation layer is located under a package layer that includes a plastic packaging material.

The position corresponding to the metal welding pad may be a region directly facing the metal welding pad.

In practice, the heat dissipation layer may be formed in a part of the region above the interconnection layer in the IC die except the metal welding pad, or the heat dissipation layer may be formed in the entire region above the interconnection layer in the IC die except the metal welding pad.

In this way, the heat dissipation layer can be in direct contact with the IC die, and can rapidly spread heat on the IC die to an entire chip, thereby increasing a heat dissipation area of the IC chip, and improving a heat dissipation capability of the chip.

Optionally, the forming, in a region above the interconnection layer except a position corresponding to the metal welding pad, the heat dissipation layer includes:

forming the heat dissipation layer above the metal layer whose distance to the active component is the farthest in the interconnection layer; and disposing an opening at a position that is at the heat dissipation layer and that is corresponding to the metal welding pad.

In this way, the IC die can be connected, in a manner of wire bonding or a bump or in another manner, to the substrate in the IC chip by using a region that is on the metal welding pad and that is not covered by the heat dissipation layer. When the IC die is connected, in the manner of wire bonding, to the substrate in the IC chip by using the region that is on the metal welding pad and that is not covered by the heat dissipation layer, a schematic structural diagram of the IC die is shown in FIG. 4a. When the IC die is connected, in the manner of the bump, to the substrate in the IC chip by using the region that is on the metal welding pad and that is not covered by the heat dissipation layer, a schematic structural diagram of the IC die is shown in FIG. 4b.

When the interconnection layer of the IC die further includes a passivation layer, the forming, in a region above the interconnection layer except a position corresponding to the metal welding pad, the heat dissipation layer includes:

forming the passivation layer above the metal layer whose distance to the active component is the farthest in the interconnection layer:

disposing an opening at a position that is at the passivation layer and that is corresponding to the metal welding pad, that is, removing the passivation layer at the position corresponding to the metal welding pad:

forming the heat dissipation layer on a surface of the passivation layer; and disposing an opening at a position that is at the heat dissipation layer and that is corresponding to the metal welding pad, that is, removing the heat dissipation layer at the position corresponding to the metal welding pad.

In this way, the IC die can be connected, in a manner of wire bonding or a bump or in another manner, to the substrate in the IC chip by using a region that is at the metal welding pad and that is not covered by the heat dissipation layer and the passivation layer. When the IC die is connected, in the manner of wire bonding, to the substrate in the IC chip by using the region that is at the metal welding pad and that is not covered by the heat dissipation layer and the passivation layer, a schematic structural diagram of the IC die is shown in FIG. 5a or FIG. 5b. When the IC die is connected, in the manner of the bump, to the substrate in the IC chip by using the region that is at the metal welding pad and that is not covered by the heat dissipation layer, a schematic structural diagram of the IC die is shown in FIG. 6a or FIG. 6b.

Optionally, when an IC chip is a wire bonding chip, and the heat dissipation layer is formed after wire bonding is performed, the forming, in a region above the interconnection layer except a position corresponding to the metal welding pad, the heat dissipation layer includes:

forming a passivation layer above the metal layer whose distance to the active component is the farthest in the interconnection layer:

disposing an opening at a position that is at the passivation layer and that is corresponding to the metal welding pad; and forming the heat dissipation layer on a surface of the passivation layer, where in this technology, an opening at a position that is at the heat dissipation layer and that is corresponding to the metal welding pad may not need to be disposed.

The IC die and the preparation method thereof provided in the embodiments of the present invention are applicable to a wire bonding chip and a flip chip, and are further applicable to a chip in another package form.

According to a heat dissipation enhanced IC chip and a preparation method thereof provided in the embodiments of the present invention, a material of a heat dissipation layer is an electrical-insulating material whose heat conductivity is high, thickness of the heat dissipation layer may be any thickness required in this technology, and a method for forming the heat dissipation layer is not limited to methods such as physical sputtering, chemical deposition, electroplating, and coating.

A person skilled in the art may understand that the accompanying drawings are merely schematic diagrams of preferred embodiments, and modules or processes in the accompanying drawings are not necessarily required for implementing the present invention.

A person skilled in the art may understand that the modules in the apparatuses provided in the embodiments may be arranged in the apparatuses in a distributed manner according to the description of the embodiments, or may be arranged in one or more apparatuses that are different from those described in the embodiments. The modules in the foregoing embodiments may be combined into one module, or split into a plurality of submodules.

The sequence numbers of the foregoing embodiments of the present invention are merely for illustrative purposes, and are not intended to indicate priorities of the embodiments.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. An integrated circuit die, comprising:
    a heat dissipation layer including an electrical-insulating material having a heat conductivity, wherein the heat dissipation layer is located under a package layer including a plastic packaging material;
    an underlay;
    an active component; and
    an interconnection layer provided between the active component and the heat dissipation layer to cover the active component which is provided between the underlay and the interconnection layer, wherein the interconnection layer comprises:
        a plurality of metal layers, and
        a plurality of dielectric layers, wherein the plurality of metal layers and the plurality of dielectric layers are alternately arranged with respect to one another, and wherein a metal layer among the plurality of metal layers which is a distant to the active component includes a metal cabling and a metal welding pad, and wherein the heat dissipation layer covers a region on the interconnection layer except a position corresponding to the metal welding pad.

2. The integrated circuit die according to claim 1, wherein the heat dissipation layer covers the metal layer among the plurality of metal layers which is the most distant to the active component.

3. The integrated circuit die according to claim 1, wherein the interconnection layer further includes a passivation layer, wherein the passivation layer covers a region on the metal layer among the plurality of metal layers which is the most distant to the active component except the position corresponding to the metal welding pad, and wherein the heat dissipation layer covers the passivation layer.

4. The integrated circuit die according to claim 1, wherein an integrated circuit chip comprising the integrated circuit die is a wire bonding chip, wherein the heat dissipation layer is formed after a wire bonding technology is applied, and wherein the heat dissipation layer further covers the position corresponding to the metal welding pad.

5. The integrated circuit die according to claim 1, wherein an integrated circuit chip comprising the integrated circuit die is a wire bonding chip or a flip chip.

6. The integrated circuit die according to claim 1, wherein an integrated circuit chip comprising the integrated circuit die is a wire bonding chip, wherein the wire bonding chip includes the package layer and a substrate to which the integrated circuit die is fastened via a bonding material provided between the underlay and the substrate, and wherein the integrated circuit die further comprises a leading wire connected between the metal welding pad and the substrate.

7. The integrated circuit die according to claim 1, wherein an integrated circuit chip comprising the integrated circuit die is a flip chip, and wherein the flip chip includes:
    the package layer;
    a substrate to which the integrated circuit die is fastened via a bump provided on the metal welding pad such that the bump electrically connects the integrated circuit die to the substrate via the bump, and
    an underfill material provided between the substrate and the heat dissipation layer to protect the bump.

8. A preparation method of an integrated circuit die, comprising:
    forming an active component on an underlay;
    forming a plurality of metal layers and a plurality of dielectric layers on a surface of the active component such that the plurality of metal layers and the plurality of dielectric layers are alternately arranged with respect to one another, wherein the plurality of metal layers and the plurality of dielectric layers constitute an interconnection layer, and wherein a metal layer among the plurality of metal layers which is a most distant to the active component includes a metal cabling and a metal welding pad; and
    forming, in a region on the interconnection layer except a position corresponding to the metal welding pad, a heat dissipation layer that includes an electrical-insulating material having a heat conductivity,
    wherein the heat dissipation layer is located under a package layer that includes a plastic packaging material, wherein the interconnection layer is provided between the active component and the heat dissipation layer, and wherein the interconnection layer covers the active component and is provided between the underlay and the interconnection layer.

9. The method according to claim 8, wherein forming the heat dissipation layer comprises:
   forming the heat dissipation layer on the metal layer among the plurality of metal layers which is the most distant to the active component; and
   disposing an opening at a position that is at the heat dissipation layer and that is corresponding to the metal welding pad.

10. The method according to claim 8, wherein the integrated circuit die further comprises a passivation layer, and wherein forming the heat dissipation layer comprises:
    forming the passivation layer on the metal layer among the plurality of metal layers which is the most distant to the active component;
    disposing an opening at a position that is at the passivation layer and that is corresponding to the metal welding pad;
    forming the heat dissipation layer on a surface of the passivation layer; and
    disposing an opening at a position that is at the heat dissipation layer and that is corresponding to the metal welding pad.

11. The method according to claim 8, wherein the integrated circuit die further comprises a passivation layer, wherein an integrated circuit chip comprising the integrated circuit die is a wire bonding chip, wherein the heat dissipation layer is formed after a wire bonding technology is applied, and wherein forming the heat dissipation layer comprises:
    forming the passivation layer above the metal layer among the plurality of metal layers which is the most distant to the active component;
    disposing an opening at a position that is at the passivation layer and that is corresponding to the metal welding pad; and
    forming the heat dissipation layer on a surface of the passivation layer.

12. The method according to claim 10, wherein the opening at the position that is at the passivation layer and that is corresponding to the metal welding pad is larger than the opening at the position that is at the heat dissipation layer and that is corresponding to the metal welding pad.

13. The method according to claim 10, wherein the opening at the position that is at the passivation layer and that is corresponding to the metal welding pad is smaller than the opening at the position that is at the heat dissipation layer and that is corresponding to the metal welding pad.

* * * * *